United States Patent
Carr et al.

[19]

[11] Patent Number: 6,158,951
[45] Date of Patent: Dec. 12, 2000

[54] WAFER CARRIER AND METHOD FOR HANDLING OF WAFERS WITH MINIMAL CONTACT

[75] Inventors: Paul R. Carr, Gilbert; Paul T. Jacobson, Phoenix; James F. Kusbel, Fountain Hills; James S. Roundy; Ravinder K. Aggarwal, both of Gilbert; Ivo Raaijmakers, Phoenix, all of Ariz.

[73] Assignee: ASM America, Inc., Phoenix, Ariz.

[21] Appl. No.: 09/113,441

[22] Filed: Jul. 10, 1998

[51] Int. Cl.[7] ....................................................... B65G 1/06
[52] U.S. Cl. ........................... 414/749; 414/937; 414/941
[58] Field of Search .................................... 414/749, 937, 414/941; 219/121.67

[56] References Cited

U.S. PATENT DOCUMENTS

| | | |
|---|---|---|
| 4,306,731 | 12/1981 | Shaw . |
| 4,473,455 | 9/1984 | Dean et al. . |
| 4,779,877 | 10/1988 | Shaw . |
| 5,046,909 | 9/1991 | Murdoch . |
| 5,093,550 | 3/1992 | Gerber et al. . |
| 5,636,964 | 6/1997 | Somekh et al. . |
| 5,697,748 | 12/1997 | Somekh et al. . |
| 5,911,326 | 6/1999 | Ikeda . |

FOREIGN PATENT DOCUMENTS

| | | | |
|---|---|---|---|
| 338870 | 12/1993 | Japan | 414/937 |
| 48515 | 2/1994 | Japan | 414/937 |
| 10-107114 | 4/1998 | Japan . | |
| 10-144744 | 5/1998 | Japan . | |

*Primary Examiner*—Gregory A. Morse
*Attorney, Agent, or Firm*—Knobbe, Martens, Olson, & Bear, LLP

[57] ABSTRACT

The invention is a carrier comprising three support elements connected by an underlying frame. The periphery of a wafer rests upon the support elements. The invention also comprises a wafer handler with a plurality of arms. Spacers space the carrier above a base plate associated with a station in a wafer handling area. An arm slides beneath the frame and between the spacers, but the handler does not contact the wafer. A method of using the handler and carrier is provided where the handler lifts and rotates the carrier with the wafer through various stations in a wafer handling area. The handler is capable of moving a plurality of carriers and wafers simultaneously.

20 Claims, 5 Drawing Sheets

WAFER CARRIER AND METHOD FOR HANDLING OF WAFERS WITH MINIMAL CONTACT

FIELD OF THE INVENTION

This invention relates to an apparatus and method for facilitating the handling and transport of semiconductor wafers, and more particularly to an apparatus and method for protectively supporting semiconductor wafers in a manner which permits easy transport between processing stations and between cassettes or other wafer transport/holding mechanisms with minimal risk of damage and contamination of the wafer.

BACKGROUND OF THE INVENTION

During semiconductor wafer processing, the wafers frequently move through several locations such as: a cassette, a load lock station where the atmosphere around the wafer is purged and the wafer may be etched, a pre-processing station where the wafer may be measured or cleaned, a reactor, and a post-processing station where the wafer is cooled, and the thickness of a deposition layer may be measured. The wafer obviously must be handled in order to move to each location; however, each time the wafer is contacted, the likelihood of backside scratching or contamination by particles is increased. These wafers can be rendered useless for device fabrication by contamination, abrasion, or damage. Therefore, extreme care is required to support and transport wafers.

U.S. Pat. No. 5,046,909 by Murdoch teaches clipping the wafer onto a retaining ring so that the ring is handled during processing instead of directly handling the wafer. A robotic arm moves the wafer to be engaged with the clips. However, the clips contact both the top and bottom of the wafer, and great precision is required in order to initially engage the wafer with the clips.

U.S. Pat. No. 4,306,731 by Shaw, and U.S. Pat. No. 4,779,877, also by Shaw, teach an apparatus comprising a plate-like support provided with an aperture of a diameter larger than the wafer, and clip means for gripping the edge of the wafer. The leading edge of each clip has an arcuate portion within which the edge of the wafer is retained. However, the Shaw inventions require that the clip must first be spread before receiving the wafer to prevent edgewise abrasion. Thus, these inventions are rather complex because additional parts are needed to actuate the clip, such as a pneumatic cylinder and contact pin.

U.S. Pat. No. 4,473,455 by Dean et al. teaches spring-mounted members disposed around the periphery of an aperture in a wafer-mounting plate. However, once the wafer is retained within the wafer-mounting plate, the wafer cannot be moved with the plate because this invention is only for use of holding the wafer during a processing step.

Consequently, a need exists for a simple wafer carrying device which is simple to use, has few parts, transportable through multiple locations, and minimizes contact with the wafer.

SUMMARY OF THE INVENTION

The present invention is a carrier that supports a wafer during most stages of wafer handling, and a method for using the carrier with a wafer handler which moves the carrier and wafer to multiple stations. An end effector removes the wafer from a cassette and places the wafer onto the carrier. The carrier has a plurality of support elements defining a wafer support plane, and a support structure or frame below the plane connecting the support elements. The periphery of the wafer rests upon the support elements. The wafer can then be moved by lifting the carrier rather than engaging the wafer.

In one example, a wafer handler arm is inserted beneath the carrier so that tie handler does not contact the wafer. The wafer handler may be provided with a plurality of arms that lift and rotate a plurality of carriers with wafers from station to station. The wafers rest safely atop the carriers, so that the handling is absorbed by the carrier instead of the wafer.

After processing, an end effector removes the wafer from the carrier back to the cassette, leaving the carrier in the handling chamber for repeated use. The use of the carrier in an environment where the wafer must be repeatedly picked up and set down reduces the number of times the wafer is contacted. This reduces the amount of backside marking on the wafer. Additionally, the carrier has locating features which assist in centering the wafer to be properly positioned for processing.

BRIEF DESCRIPTION TO THE DRAWINGS

DETAILED DESCRIPTION OF THE PREFERRED EMBODIMENT

Figure 1:
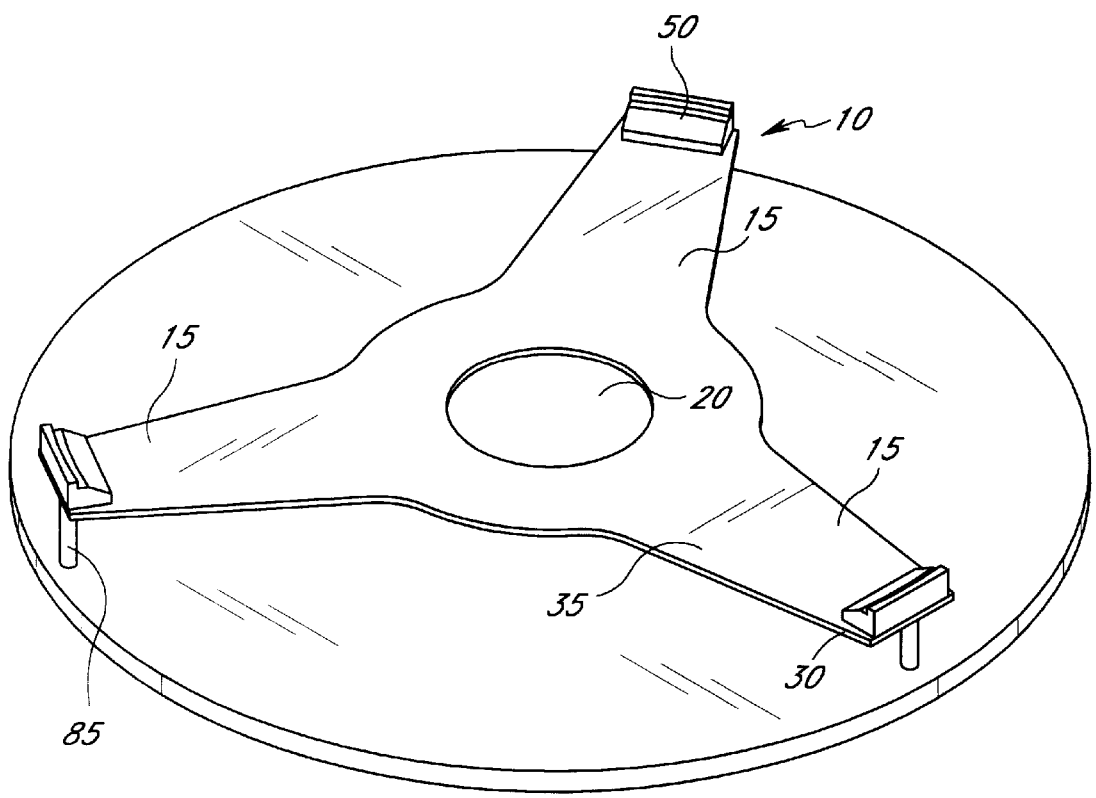
FIG. 1 is a perspective view of a wafer carrier supported by spacers extending from a base plate.
Figure 2:
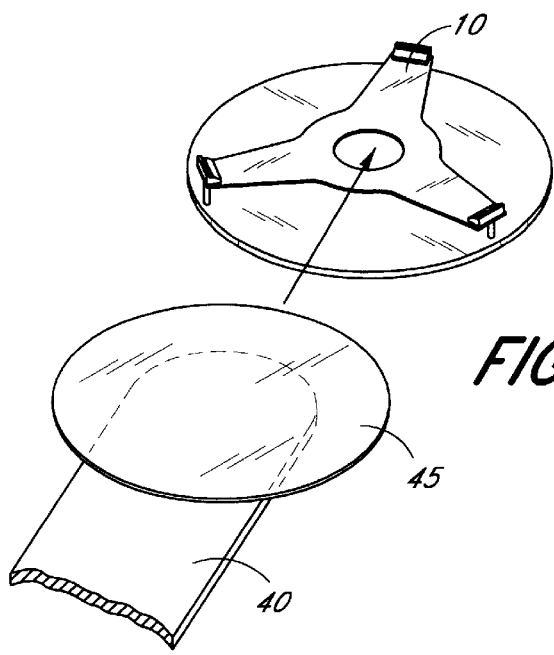
FIG. 2 is a perspective view of an end effector carrying a wafer.
Figure 3:
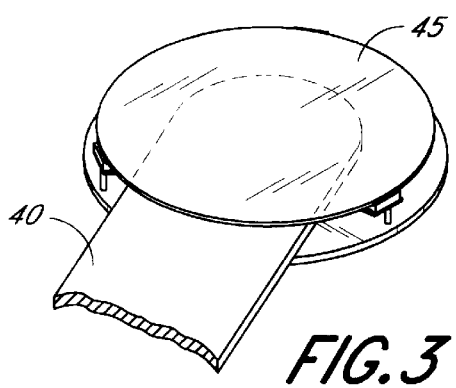
FIG. 3 is a perspective view of an end effector placing a wafer on top of the support blocks of a carrier.
Figure 4:
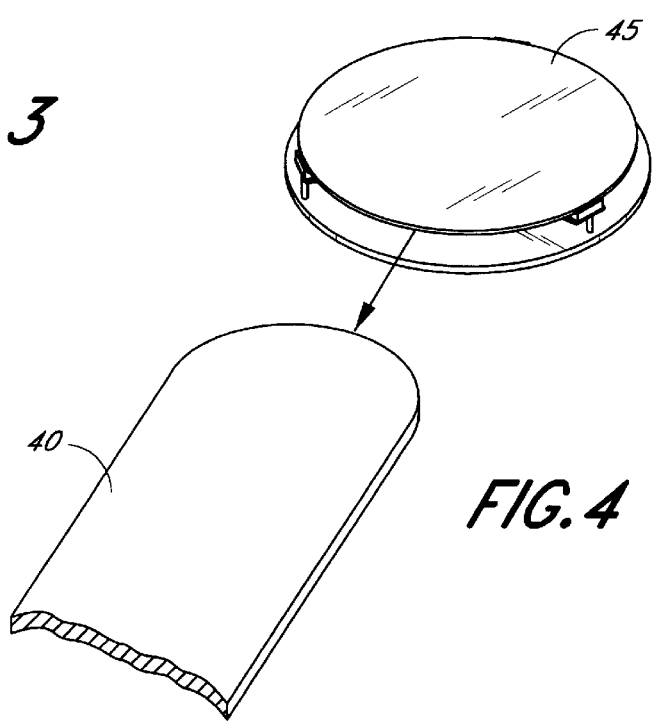
FIG. 4 is a perspective view of a withdrawn end effector after placing a wafer on top of the support blocks of a carrier.

Referring now to the drawings, and particularly to FIG. 1, a carrier of the invention is shown schematically and indicated generally by the number 10. In a preferred embodiment, the carrier 10 is shown with a frame or structure formed by three flat arms 15 extending outward from its center and defining a generally flat wall. The carrier 10 is preferably made of a metal such as aluminum, including anodized aluminum, or a ceramic material such as alumina, or any material which will not interfere with wafer processing. The carrier 10 may have a hole 20 in its center to decrease its weight. The arms 15 have portions 35 positioned inwardly with respect to the outer ends 30. The inner portions 35 are spaced beneath the plane to enable an end effector 40 to extend beneath the plane to facilitate the transfer of a wafer 45 between the end effector 40 and the carrier 10. In the arrangement shown in FIGS. 2–4, the end effector 40 is a flat paddle, and the space between the wafer support plane and the arm portions 35 is sufficient to enable the end effector 40 to be inserted in that space. For other types of end effectors which place the wafer upon the carrier from a different position, the space may be minimal.

The configuration of the carrier 10 may be other than the "star" embodiment shown in FIG. 1, as long as the carrier provides adequate support to the periphery of the wafer, and an underlying frame or support structure connecting the points are configured so that an end effector may transfer the wafer to and from the carrier, such as an end effector fitting into the wafer support plane and retracting after placing the wafer on the carrier.

Figure 5:
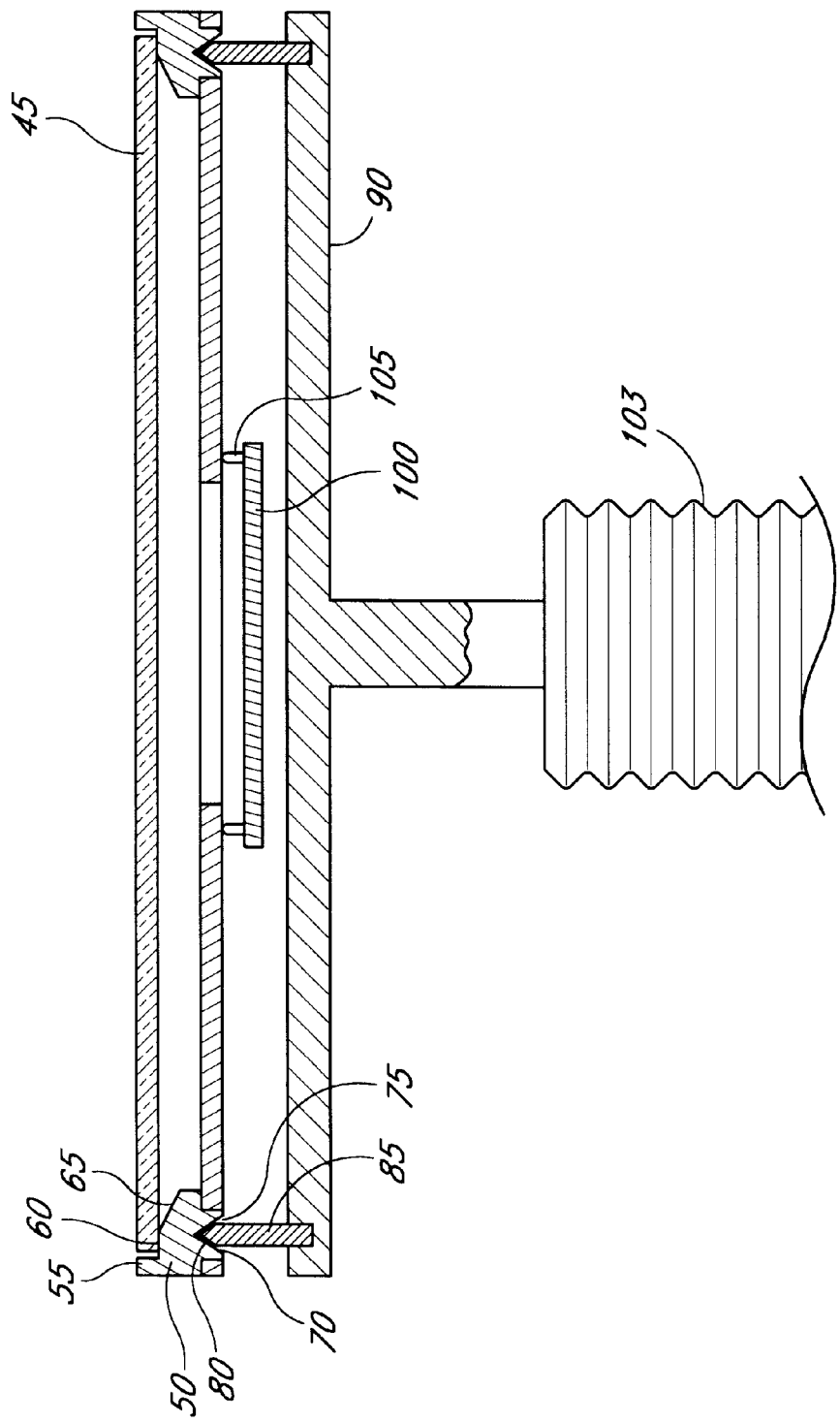
FIG. 5 is a sectional view of the carrier, an outer end of a wafer handler arm, and a base plate along line 5—5 of FIG. 1.

A wafer support block 50 is connected to the outer end 30 of each carrier arm 15. The wafer support blocks 50 define a horizontal wafer support plane. The wafer support block is preferably made of quartz or a high temperature plastic. One suitable example is polybenzimidazole sold under the trademark Celazole PBI. In the embodiment shown in FIG. 5, the block 50 has a lip 55 at the top of the periphery to restrain the wafer 45 from horizontal movement, and an upper support surface 60 upon which the wafer 45 rests. The lip 55 also helps in automatically centering the wafer when it is placed on the carrier by the end effector. The upper support surface 60 may have a chamfer 65 to minimize the contact area between the wafer support block 50 and the wafer 45. This also prevents the wafer from falling in between the blocks in case the wafer is not exactly in the center. The upper support surface 60 and chamfer 65 are sized such that only the portion of the wafer which will not be used, commonly known as the "exclusion zone," contacts the wafer support block 50. Each block 50 is attached by a pair of screws (not shown) which extend through the carrier arm and thread into the block. Of course, other attachment means may be employed.

The block 50 has a protuberance 70 which is received through a hole 75 in the carrier arm 30. The protuberance 70 has a downwardly facing socket or recess 80 to receive a spacer 85. The spacer 85 may either be connected to the carrier 10 or extend upward from a base plate 90 in the wafer handling area 95 (see FIGS. 6–8). The spacers 85 create a gap between the bottom of the carrier 10 and the top of the base plate 90 where the wafer handler 25 is inserted to transport the carrier 10 and wafer 45 without contacting the wafer 45. The spacer and socket combinations help in precise positioning of the carriers as they are moved from stations to station by the handler. The carrier 10 need not have separate wafer support blocks 50, but may have support points of unitary construction with the carrier 10.

Figure 6:
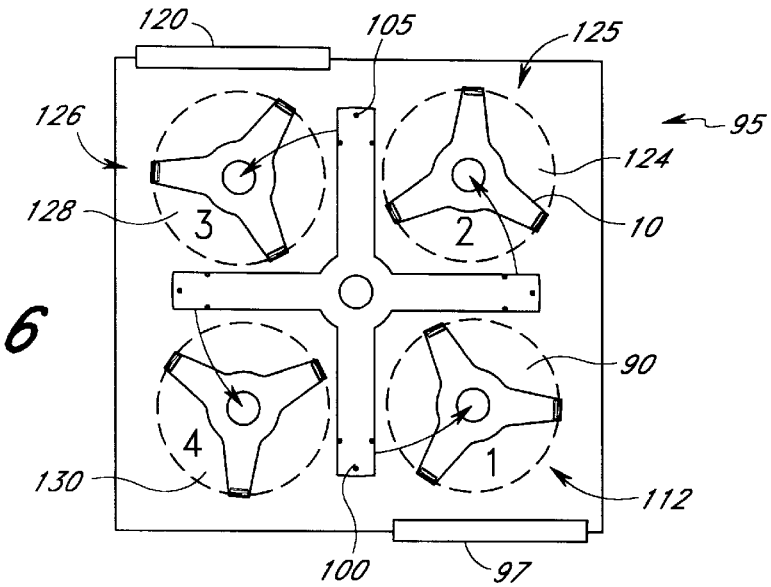
FIG. 6 is a top view of the wafer handling area where the wafer handler is in a neutral position.
Figure 7:
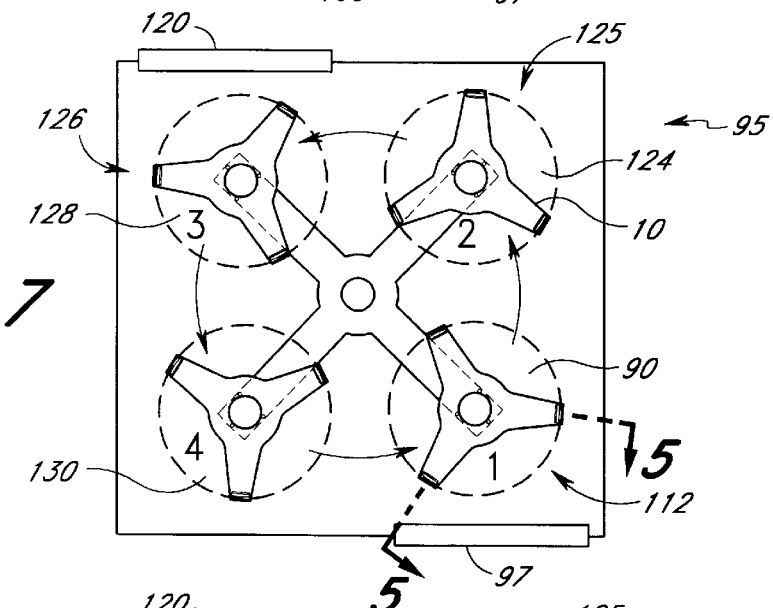
FIG. 7 is a top view of the wafer handling area after the wafer handler has rotated 45° counterclockwise so that the outer end of each wafer handler arm is beneath a carrier and above a base plate.
Figure 8:
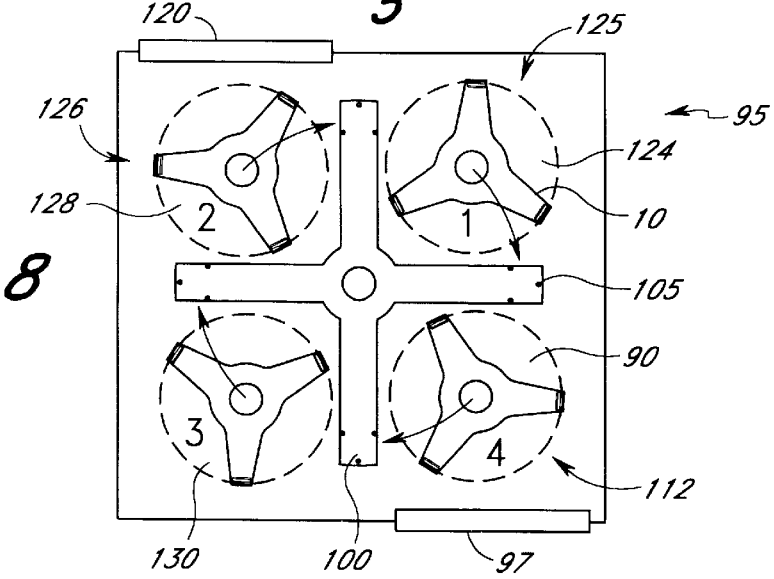
FIG. 8 is a top view of the wafer handling area after the wafer handler has moved the wafers to the next station.
Figure 9:
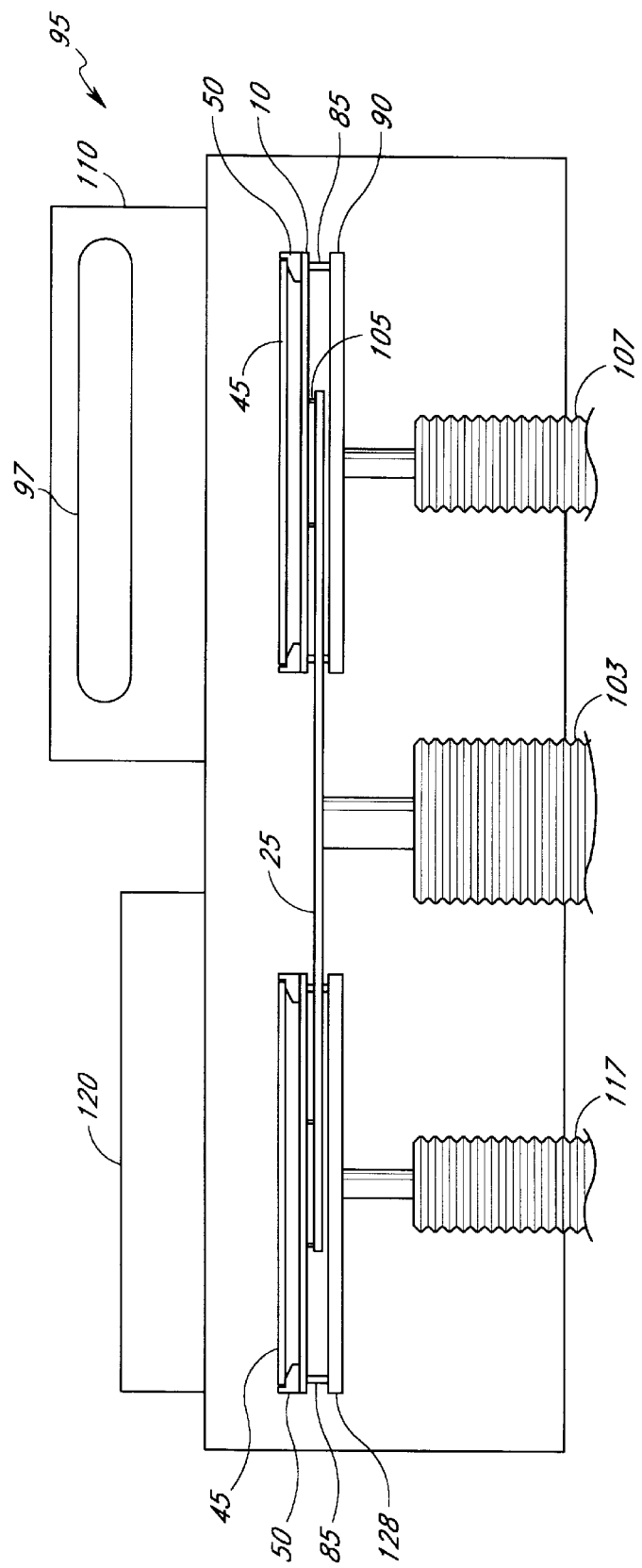
FIG. 9 is a schematic view of the wafer handling area.

The carrier is useful to minimize contact with the wafer in any wafer handling operation with robotic end effectors or wafer handlers. FIGS. 6–8 illustrate an arrangement for moving the carrier in a circular pattern. The wafer handler 25 has four arms 100 extending from its center at 90° intervals. The wafer handler 25 can rotate in a planar direction about its center in both a clockwise and counterclockwise direction, and is also vertically adjustable by an elevator 103. The thickness of the tip of each arm 100 is less than the height of the space between the bottom of the carrier 10 and the top of the base plate 90, so that the handler arm 100 may be inserted in said space without shifting the carrier 10 relative to the base plate 90. While the carrier 10 is transported by the wafer handler 25, the central portion of the carrier 10 rest upon pins 105 extending upward from the outer edge of the handler arm 100. Preferably three pins are employed to provide adequate support, while limiting contact to minimize particle formation.

Each of the stations in the wafer handling area 95 includes a base plate that is approximately the same size as the wafer to be processed and three spacers 85. The elevation and orientation of the spacers 85 facilitate the insertion of the wafer handler arms 100 under the carriers 10. The first station 112 is below the load lock chamber 110 where the atmosphere around the wafer 45 is purged. The second station may be a pre-processing station 125 where the wafer 45 may be measured or cleaned. At the third station 126, the wafer may be lifted and transferred through a gate 120 to the processing chamber and then returned to the carrier 10 after processing. The fourth station may be a post-processing station 130 where the wafer 45 may be cooled, and the thickness of a deposition layer may be measured.

In operation, the robotic arm end effector 40 is inserted beneath the wafer 45 and places the wafer 45 onto the support blocks 50 on a carrier 10. The arms 100 of the wafer handler 25 are rotated 45° counterclockwise from the neutral position showm in FIG. 6 to the position shown in FIG. 7. As seen, an arm 100 is inserted between the spacers 85 of the first base plate 90, and between the first base plate 90 and below the carrier 10. The wafer handler arm 100 then lifts the carrier 10 with the first wafer 45 so that the carrier 10 with the first wafer 45 is resting on the pins 105 at the end of the wafer handler arm 100. The wafer handler 25 then rotates 90° counterclockwise so that the carrier 10 and first wafer 45 are directly above a second base plate 124. The handler then lowers the carrier 10 and first wafer 45 onto the second base plate 124 and centers the carrier 10 so that the recesses 80 in the protuberances 70 of the wafer support blocks 50 mate with the respective spacers 85. Note that the recesses 80 are tapered to guide the spacers 85 into the desired position in the event of any slight misalignment of the carrier 10 on the handler arm 100.

After transferring the carrier 10 to the spacers 85 on the plate 124, the pins 105 on the end of the wafer handler arm 100 are no longer contacting the carrier 10. The carrier 10 then rotates clockwise so that the wafer handler arm 100 is no longer under the carrier 10 and the first wafer. Note that the spacers 85 must be properly oriented to permit this arm 100 movement. With the spacers properly oriented, the rotation sequence could be reversed so that the arm moves 45° clockwise, then 90° clockwise, and then 45° counterclockwise to move the carrier 10 in a clockwise direction.

This wafer movement process is repeated so that the wafer handler 25 lifts and rotates the carrier 10 and wafer 45 through all the stations of the wafer handling area 95. When the carrier 10 and wafer 45 return to the first base plate 90, the end effector 40 removes the wafer 45 from the carrier 10 and returns it to its original place in the cassette. While the first wafer 45 is located at the second station 125, a second wafer is transferred to a second carrier at the first station 110. The second wafer on the second carrier similarly is lifted and rotated through the stations of the wafer handling area 95. As shown, four carriers 10 reside with the system at all times and the wafer handler arms 100 continuously transport the carriers 10 from one position to another. Thus, four wafers may be moved through the wafer handling area 95 at one time, one wafer at each station.

In one specific arrangement, the robotic arm end effector 40 is inserted beneath a first wafer 45 waiting to be processed from a slot in a cassette or other wafer source (not shown). The end effector 40 transfers the wafer 45 from the cassette to the support blocks 50 on a carrier 10. The carrier 10 is located on the first base plate 90 in the wafer handling area 95. A first gate valve 97 is opened so that an elevator 107 raises the first base plate 90 into the load lock chamber 110, positioned above the first base plate 90, until the base plate 90 is properly seated in the load lock chamber 110. The edge of the base plate 90 is designed to form an air tight seal with a cylindrical entry to the load lock chamber 110. While the elevator is in the raised position and the first gate valve 97 is closed, the load lock chamber 110 is purged with a purge gas. After the purging is finished inside the load lock chamber 110, the elevator 107 below the first base plate 90 lowers the first base plate 90 from the load lock chamber 110. Then, as previously discussed above, one of the arms 100 of the wafer handler 25 is rotated 45° counterclockwise from the neutral position shown in FIG. 6 to the position shown in FIG. 7. The same steps as discussed above are followed to move the wafer 45 on the carrier 10 with the wafer handler 25 to the second base plate 124.

A second gate valve 120 is positioned adjacent to a third base plate 128. An elevator 117 below the third base plate 128 raises the third base plate 128 to a higher level so that the wafer 45 may be retrieved by a robotic arm (not shown) to the processing chamber (not shown). Elevator 103 is preferably mechanically controlled while elevators 107 and 117 are preferably pneumatic devices. The gate valve 120 is then closed and the wafer 45 is ready for processing. After processing, the gate valve 120 is opened and the robotic arm transfers the wafer 45 back to the carrier 10 on the third base plate 128, and the elevator 117 lowers the third base plate 128. Then, as discussed above, the wafer handler arms 100 are rotated to move the carrier 10 with the processed wafer 45 to the fourth base plate 130 for post-processing. After the post-processing is completed, the wafer handler arms 100 once again move carrier 10 with wafer 45, as described above, back to the first base plate 90. Here, the end effector 40 is inserted beneath the wafer 45, and lifts the wafer 45 from the carrier 10 to return the wafer 45 back to the cassette.

As can be seen, four wafers may be moved through the four stations at one time, one wafer at each station. The use of the carrier 10 with the wafer 45 is not limited to transporting the wafer 45 through a wafer handling station, but may also be used in any application where a wafer must be moved. Also, the wafer handler described above is not limited to rotational movement, but may move in any direction to move a carrier from one location to another.

What is claimed is:

1. An apparatus for handling semiconductor wafers comprising:
   a carrier for supporting a wafer as the carrier is transferred from one location to another by a wafer handler, said carrier having a surface adapted to be engaged by the handler, but the carrier being separate from the handler so that the carrier may be deposited in a desired location while the handler is withdrawn from the carrier, said carrier having a plurality of arms having outer ends defining a wafer support plane, the outer ends being configured to engage the periphery of a wafer, said arms having interconnecting portions positioned inwardly with respect to the outer ends, and configured to enable an end effector to facilitate the transfer of the wafer between the end effector and the carrier, said carrier having no structure extending radially beyond the outermost portion of each of said arms.

2. The apparatus of claim 1, including a plurality of spacers which connect with said carrier to space the carrier above a support surface to allow the insertion of a wafer handler beneath the carrier so as to move the wafer from one location to another without contacting the wafer.

3. An apparatus for handling semi-conductor wafers comprising:
   a wafer carrier for supporting a wafer as the carrier is transferred from one location to another, said carrier having a plurality of arms having outer ends defining a wafer support plane, the outer ends being configured to engage the periphery of a wafer, said arms having interconnecting portions positioned inwardly with respect to the outer ends and configured to enable an end effector to facilitate the transfer of the wafer between the end effector and the carrier; and
   a plurality of spacers which cooperate with said arms to space the carrier above a support surface to permit the insertion of a wafer handler arm beneath the carrier so as to move the wafer from one location to another without contacting the wafer.

4. The apparatus of claim 1 wherein the arm outer ends are spaced to permit the insertion of the end effector beneath said wafer support plane.

5. The apparatus of claim 1, wherein said carrier has a central hub and three arms extending outwardly from the hub.

6. The apparatus of claim 1 wherein each of the carrier arm outer ends include a wafer support block to engage the wafer.

7. The apparatus of claim 6, wherein said support block includes a lip at the top of the periphery of said support block to automatically center and restrain the wafer from horizontal movement, and an upper support surface upon which the wafer rests.

8. An apparatus for handling semiconductor wafers comprising:
   a wafer carrier for supporting a wafer as the carrier is transferred from one location to another, said carrier having a plurality of arms having outer ends defining a wafer support plane, the outer ends being configured to engage the periphery of a wafer, said arms having interconnecting portions positioned inwardly with respect to the outer ends, and configured to enable an end effector to facilitate the transfer of the wafer between the end effector and the carrier, each of the carrier arm outer ends including a wafer support block to engage the wafer, said support block includes a lip at the top of the periphery of said support block to automatically center and restrain the wafer from horizontal movement, and an upper support surface upon which the wafer rests, each wafer support block having a portion which mates with a spacer for spacing the carrier above a support surface.

9. An apparatus for handling semiconductor wafers comprising:
   a wafer carrier for supporting a wafer as the carrier is transferred from one location to another, said carrier having a plurality of arms having outer ends defining a wafer support plane, the outer ends being configured to engage the periphery of a wafer, said arms having interconnecting portions positioned inwardly with respect to the outer ends, and configured to enable an end effector to facilitate the transfer of the wafer between the end effector and the carrier, each of the carrier arm outer ends including a wafer support block to engage the wafer, each wafer support block having a protuberance which extends to a hole in the carrier arm.

10. The apparatus of claim 9 wherein the protuberance has a recess to receive the spacer.

11. An apparatus for handling semiconductor wafers comprising:
   a carrier having a plurality of wafer support elements defining a wafer support plane;
   a supporting frame below the wafer support plane; and a wafer handler for moving the carrier, said handler having a plurality of arms extending outwardly from the center of said wafer handler, each arm being adapted to be removably positioned beneath the carrier frame so that upon relative vertical movement between the arm and the carrier, the carrier is supported by the arm and is horizontally movable by the arm and deposited at a second location, whereby the wafer is moved without being contacted by the arm.

12. The apparatus of claim 11 wherein said frame includes a plurality of arms having outer ends defining said wafer support plane, said carrier having arm portions positioned inwardly with respect to the outer ends, and spaced beneath said wafer support plane sufficiently to enable an end effector to extend beneath said plane and above said arm portions to facilitate the transfer of the wafer between the end effector and the carrier.

13. The apparatus of claim 11 wherein said wafer handler is capable of planar rotation about a center of said wafer handler.

14. The apparatus of claim 12, wherein said wafer handler is capable of vertical movement.

15. The apparatus of claim 11, wherein said carrier has a central hub and three arms extending outwardly from the hub.

16. An apparatus for handling semiconductor wafers comprising:

a carrier having a plurality of wafer support elements defining a wafer support plane;

a supporting frame below the wafer support plane; and a wafer handler for moving the carrier, said handler having a plurality of arms extending outwardly from the center of said wafer handler, each arm being adapted to be positioned beneath the carrier, the wafer handler having three pins located on the outer end of the upper surface of the handler arms, said pins being made of material which will not interact with the carrier to substantially produce contaminants.

17. An apparatus for handling semiconductor wafers comprising; a carrier having three equally spaced arms radiating from a central hub, each carrier arm adapted to be engaged by a spacer which extends upwardly from a support to space said carrier from said support, a wafer support plane defined by the three outer portions of said arms, said plane being sufficiently spaced above said central hub to enable a robotic arm end effector to extend beneath said plane and above said arm portions to facilitate the transfer of the wafer between the end effector and the carrier, and the outer portion of each carrier arm having a wafer support block for engaging the periphery of a wafer, said wafer support block having a unitary lip at the top of the outer periphery of said support block to restrain the wafer from horizontal movement, and an upper support surface upon which the wafer rests, the bottom surface of each wafer support block having a protuberance which mates with the spacer extending from the support, and the outer portion of each carrier arm having at least one hole which receives the protuberance of the wafer support block, and a wafer handler for moving the carrier.

18. The apparatus of claim 17 wherein, said handler has a plurality of arms radiating from the center of said wafer handler, said wafer handler being capable of vertical movement and planar rotation about the center of said wafer handler to enable each handler arm to move beneath a carrier, and transfer the carrier and the wafer from one location to another without contacting the wafer.

19. A carrier for a semiconductor wafer comprising:

a support structure including a plurality of radially extending, generally flat support arms having inner ends that are connected and having outer ends that are otherwise unsupported; and a plurality of wafer supports connected to and extending above the outer ends of the arms and defining a wafer support plane generally parallel to and spaced above said arms, said arms having a generally flat lower surface to be removably engaged by a wafer handler for moving the carrier, and a wafer on the carrier, said carrier being separate from the handler so that the carrier may be moved from one location to another and separated from the handler without having the handler contact the wafer.

20. The carrier of claim 19 wherein said carrier has three radially extending arms defining said bottom.

* * * * *